United States Patent [19]
Klein et al.

[11] Patent Number: 5,770,519
[45] Date of Patent: Jun. 23, 1998

[54] COPPER RESERVOIR FOR REDUCING ELECTROMIGRATION EFFECTS ASSOCIATED WITH A CONDUCTIVE VIA IN A SEMICONDUCTOR DEVICE

[75] Inventors: Richard K. Klein, Mountain View; Darrell Erb, Los Altos; Steven Avanzino; Robin Cheung, both of Cupertino; Scott Luning, Menlo Park; Bryan Tracy, Oakland; Subhash Gupta, San Jose; Ming-Ren Lin, Cupertino, all of Calif.

[73] Assignee: Advanced Micro Devices, Inc., Sunnyvale, Calif.

[21] Appl. No.: 464,305

[22] Filed: Jun. 5, 1995

[51] Int. Cl.⁶ .................. H01L 21/4763; H01L 21/44
[52] U.S. Cl. .................. 438/639; 438/643; 438/687
[58] Field of Search .................. 437/190, 192, 437/194, 195, 203, 198, 189, 957; 256/762; 438/639, 643, 687

[56] References Cited

U.S. PATENT DOCUMENTS

| 5,098,860 | 3/1992 | Chakravorty et al. | 437/198 |
| 5,308,793 | 5/1994 | Taguchi et al. | 437/203 |
| 5,358,621 | 10/1994 | Oyama | 437/192 |
| 5,470,789 | 11/1995 | Misawa | 437/203 |
| 5,474,651 | 12/1995 | Huebner | 438/639 |
| 5,527,739 | 6/1996 | Parrillo et al. | 437/198 |
| 5,534,463 | 7/1996 | Lee et al. | 438/643 |
| 5,654,232 | 8/1997 | Gardner | 438/687 |

FOREIGN PATENT DOCUMENTS

| 5-152292 | 6/1993 | Japan . |
| 5-152448 | 6/1993 | Japan . |

OTHER PUBLICATIONS

IBM Technical Disclosure Bulletin, vol. 36, No. 02, "Electroless Plating Scheme to Hermatically Seal Copper Features", Feb. 1993.

*Primary Examiner*—Brian Dutton
*Attorney, Agent, or Firm*—Foley & Lardner

[57] ABSTRACT

A multilayer semiconductor structure includes a conductive via. The conductive via includes a reservoir of metal having a high resistance to electromigration. The reservoir is made from a conformal layer of copper, or gold deposited over the via to form a copper, or gold plug located in the via. A barrier layer is provided between the reservoir and an insulating layer to prevent the reservoir from diffusing into the insulating layer. The barrier layer and reservoir may be deposited by sputtering, collimated sputtering, chemical vapor deposition (CVD), dipping, evaporating, or by other means. The barrier layer and reservoir may be etched by anisotropic dry etching, plasma-assisted etching, or other layer removal techniques.

19 Claims, 5 Drawing Sheets

COPPER RESERVOIR FOR REDUCING ELECTROMIGRATION EFFECTS ASSOCIATED WITH A CONDUCTIVE VIA IN A SEMICONDUCTOR DEVICE

CROSS-REFERENCE TO RELATED APPLICATIONS

This application is related to U.S. patent application Ser. No. 08/590,781, entitled "Copper Pellet for Reducing Electromigration Effects Associated with a Conductive Via in a Semiconductor Device", filed on an even date herewith; and U.S. patent application Ser. No. 08/462,144, entitled "Multilayer Conductive Line for Reducing Electromigration Effects Associated with a Conductive Via in a Semiconductor Device", filed on an even date herewith.

FIELD OF THE INVENTION

The present invention relates to an integrated circuit semiconductor device, and more particularly to a method and apparatus for reducing electromigration failures on a conductive line and at a conductive via in a semiconductor device.

BACKGROUND OF THE INVENTION

In general, as semiconductor devices or integrated circuits have become smaller, the corresponding current densities across the metal conductors in the devices have increased. Metal conductors typically have an upper current density limit imposed by the phenomenon of electromigration. For example, aluminum conductors experience electromigration problems at current densities of approximately $10^5$ amperes per square centimeter ($A/cm^2$).

Electromigration refers to the transport of mass in metals due to electric current. Electromigration is caused by the transfer of momentum from the electrons associated with the electric current to the positive metal ions. When a significant amount of current passes through thin metal conductors in semiconductor devices or integrated circuits, the metal ions associated with the thin metal conductors are transported and tend to accumulate in some regions and be removed from other regions. The accumulation or pileup of the metal ions can short circuit adjacent conductors in the device. The removal of metal ions in other regions may create voids which result in an open circuit. Short circuits and open circuits caused by electromigration often result in device failure.

Electromigration is a particular problem in multilayer semiconductor devices which include conductive vias or contacts connecting at least two conducting lines or paths. Conductive lines in semiconductor devices are generally thin layers (e.g., approximately 4,000 Angstroms (Å) thick) of aluminum (Al) or an alloy of Al. The excessive current density associated with the conductive vias cause electromigration problems on the conductive line. The area proximate the conductive via commonly experiences excessive current densities because current from two or more conductive paths generally merges at the conductive via. Generally, a void is formed on one side of the via and a pile-up is formed on the other side of the via in accordance with the direction of current flow through the via.

Typically, the Al conductive lines are doped with copper (Cu) (e.g., alloying the aluminum with 0.5%–2% of Cu). Al conductive lines are generally doped with less than 2% Cu because higher concentrations of Cu make the lines difficult to dry etch. The Cu in the Al conductive line makes the conductive line less susceptible to the harmful effects of electromigration due to the higher electromigration resistance of the Cu. However, even conductive lines containing approximately 1% Cu or more are susceptible to electromigration as semiconductor devices become smaller and consequently, current densities increase.

Thus, there is a need for a multilayer semiconductor structure which is less susceptible to the harmful effects of electromigration. There is also a need for a conductive via which does not create electromigration problems on the conductive line. There is further a need for semiconductor structure having lightly doped (less than 2% Cu) Al conductive line which is less susceptible to electromigration problems proximate the via.

SUMMARY OF THE INVENTION

The present invention relates to an improved multilayer semiconductor structure. The semiconductor structure includes a barrier layer formed over a conductive line and an insulating layer formed over the barrier layer. A via extends through the insulating layer and the barrier layer. The improvement includes a barrier sidewall within the via and a reservoir of metal having a high resistance to electromigration. The reservoir is situated within the via and coupled to the conductive line. The reservoir reduces electromigration failures associated with the conductive line.

The present invention also relates to a method of fabricating a semiconductor structure. The structure includes a conductive line formed over an insulating layer. The insulating layer has a top side and a via extending from the top side of the insulating layer to a bottom. The semiconductor structure is less susceptible to electromigration failures associated with the via. The method includes the steps of depositing a conformal barrier layer over and in the via, removing the conformal barrier layer from the top side of the insulating layer and the bottom of the via, thereby leaving a barrier sidewall in the via, and depositing a metal having a high resistivity to electromigration within the via, thereby reducing electromigration failures on the conductive line.

The present invention further relates to a semiconductor structure including a conductive line, an insulating layer formed over the conductive line, and a conductive via. The conductive via extends from a top side of the insulating layer to the conductive line. The via has a reservoir of metal having a high resistance to electromigration. The reservoir is situated within the via and coupled to the conductive line. The reservoir reduces electromigration failures associated with the conductive line.

In one aspect of the present invention, a reservoir of metal having a high resistance to electromigration is provided in the conductive via. A combined barrier layer (e.g., etch stop for subsequent reactive ion etching and a nucleating material) such as silicon nitride or titanium nitride is deposited in the via to form a spacer or sidewall. The barrier layer advantageously prevents the metal reservoir from diffusing into the insulating layer. The reservoir is preferably a copper (Cu), gold (Au) plug. Alternatively, the reservoir can be an alloy or compound containing one or more of the above listed metals.

In another aspect of the present invention, the copper reservoir is provided as a hollow cylinder (e.g., rectangular, circular or other shape) or copper liner in the via. The hollow cylinder is further filled with a tungsten plug. The copper reservoir is deposited by a sputter technique or chemical vapor deposition (CVD) and etched to create the hollow cylinder remaining in the via.

The present invention advantageously reduces electromigration due to high current densities associated with the conductive via. The reservoir of metal having a high electromigration resistance supplies metal ions or atoms to the critical region of the conductive line beneath the contact or via. The supply of metal ions prevents pileups and voids from forming on the conductive line. The metal such as Cu advantageously provides an "infinite" supply of atoms which migrate before the Al or other metal atoms in the conductive line. Since the Cu atoms migrate first, the Al atoms or other metal atoms in the conductive line do not migrate, and hence, voids are prevented from forming. Thus, the selective supply or source of metal such as Cu near the via reduces problems associated with electromigration and yet allows the conductive line to be made from an alloy which is easily etched.

BRIEF DESCRIPTION OF THE DRAWINGS

Preferred embodiments of the invention will hereinafter be described in conjunction with the appended drawings, wherein like numerals denote like elements, and.

DETAILED DESCRIPTION OF PREFERRED EXEMPLARY EMBODIMENTS

Figure 1:
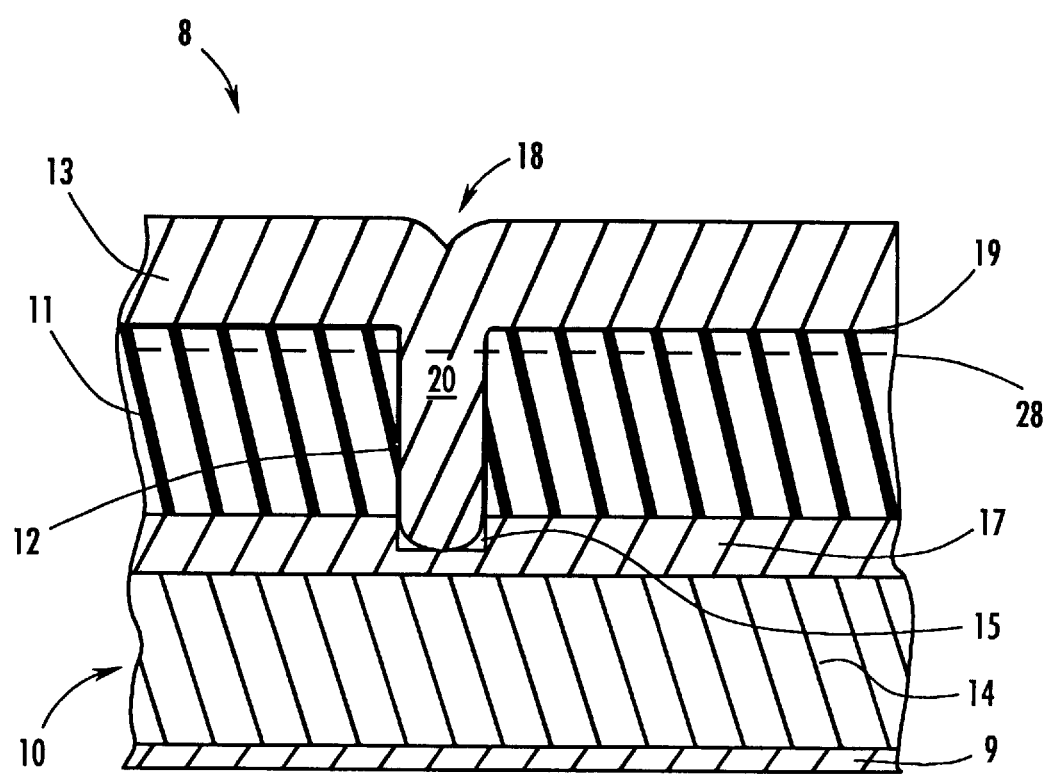
FIG. 1 is a cross-sectional view of a prior art multilayer semiconductor device including a conductive via.

Referring to FIG. 1, a prior art semiconductor device or structure 8 includes a conductive line 13, a conductive line 10, a barrier layer 17, an insulating layer 11, and a conductive via 18. Conductive line 10 is overcoated with barrier layer 17, which is overcoated with insulating layer 11. Insulating layer 11 includes a hole or via 12 extending from a top surface 19 of insulating layer 11 to a bottom 15. Bottom 15 is in contact with barrier layer 17 between insulating layer 11 and conducting line 10. A tungsten plug 20 fills via 12 to form a conductive via 18. Conductive line 13 is similar to conductive line 10 and situated above insulating layer 11.

Conductive line 10 includes a 250 angstrom (Å) thick bottom layer 9 of titanium (Ti) and a 4000 Å thick aluminum (Al) layer 14. Alternatively, conductive line 10 can be fabricated without a seed layer such as layer 9. Layer 9 serves as a seed layer for the deposition of layer 14. Layer 14 is doped with 1% copper (Cu) to make layer 14 more electromigration resistant. Preferably, the level of Cu in layer 14 is chosen so that conductive line 10 may be easily processed and etched (e.g., less than 2%). Barrier layer 17 serves as an etch stop for subsequent reactive ion etching (RIE) and a nucleating material. Barrier layer 17 is preferably a 1,100 Å thick layer of titanium nitride (TiN) and is deposited on top of layer 14. Layer 17 is typically conductive.

Insulating layer 11 is preferably a 4,000 Å to 6,000 Å thick layer of PECVD TEOS oxide or $SiH_4$ based PECVD oxide which is blanket deposited on barrier layer 17. Via 12 is typically dry etched in insulating layer 11 from top surface 19 to bottom 15 in barrier layer 17. A plug 20 is formed in via 12 extending from top surface 19 to bottom 15. Conductive line 28 is applied to top surface 19 of layer 11 and is electrically coupled to conductive line 10 through plug 20 of conductive via 18.

The fabrication of semiconductor structure 8 is described in more detail as follows. After layers 17, 14, and 9 are deposited by a physical vapor deposition (PVD), sputtering deposition, collimated sputtering deposition, dipping, evaporating, or other application technique, conductive line 10 is etched in accordance with a photoresist mask by a plasma etching technique to form a conductive pattern. Alternatively, the conductive pattern for conductive line 10 can be formed by a wet etching, or other fabrication process. After the conductive pattern is formed, a 2.0 micron or greater layer (not shown) of PECVD TEOS or other insulating material is deposited on top of conductive line 10 to form insulating layer 11.

The approximately 2.0 micron layer is chemical mechanical polished (CMP) back approximately 1.4 to 1.6 microns to top surface 19 to form a 4000 Å to 6000 Å thick layer 11 which is planarized (e.g., flushed with filled spaces over conductive line 10). After structure 23 is polished or planarized, vias such as via 12 are formed in insulating layer 11 by a photoresist mask and plasma etching process or other hole forming technique.

After via 12 is formed, a glue layer (not shown) of Ti/TiN is deposited on top surface 19 of insulating layer 11. A conformal layer (not shown) of Tungsten (W) is deposited on top of the glue layer. The conformal layer fills via 12. A CMP technique having a high selectivity of the glue layer of Ti/TiN and the conformal layer of W with respect to layer 11 is used to remove all the W and glue layer from top surface 19 of layer 11, thereby leaving plug 20 in via 12. Plug 20 extends from top surface 19 to bottom 15 and electrically couples line 13 to line 10. Plug 20 is flush or planarized with respect to top surface 19. After plug 20 is formed, conductive line 13 is formed similar to line 10 on top surface 19 of layer 11.

Electromigration failures typically occur on conductive line 10 proximate conductive via 18 due to large current densities associated with conductive via 18. Electromigration may create voids in conductive line 10 as metal atoms such as Al or Cu atoms or ions present in layer 14 are transported away from the proximity of conductive via 18. Additionally, the Al or Cu ions may pile up or accumulate on conductive line 10 and create shorts to adjacent conductors (not shown).

Figure 2:
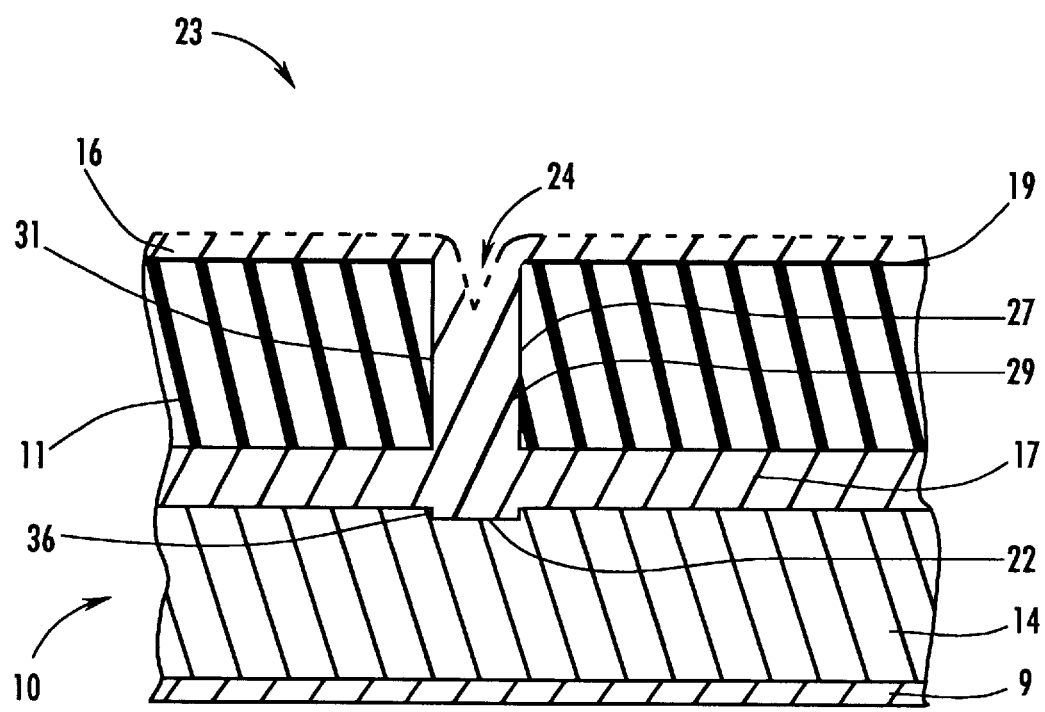
FIG. 2 is a cross-sectional view of a multilayer semiconductor device including a conformal barrier layer in accordance with a first exemplary embodiment of the present invention.

Referring to FIG. 2, a semiconductor structure 23 is less susceptible to the harmful effects of electromigration and includes a conductive via 24. Structure 23 is similar to structure 8, wherein like designators denote like elements; however, structure 23 includes a conformal barrier layer 16 deposited on top surface 19 of insulating layer 11 and in a hole or via 31. Via 31 extends from top surface 19 of insulating layer 11 to a bottom 22 which is in contact with Al layer 14 of conductive line 10. Via 31 extends through barrier layer 17 to layer 14.

Conductive via 24 includes barrier spacers or sidewalls 29 formed within via 31 on walls 27 of insulating layer 11.

Sidewalls 29 are formed by depositing conformal layer 16 (dashed line) of barrier material such as TiN, $Si_3N_4$ or SiN and anisotropically or directionally etching layer 16 so that only sidewalls 29 remain in via 31. Alternatively, other fabrication techniques for producing sidewalls 29 can be utilized.

After sidewalls 29 are in place, a reservoir (not shown in FIG. 2) can be placed in via 31 to provide a supply of metal ions for conductive via 24. The reservoir may be gold (Au), Cu or other metal, alloy or compound which has a high resistance to electromigration.

Conformal layer 16 is deposited by a sputtering, chemical vapor deposition (CVD), collimated sputtering, dipping, evaporating, or other application technique to cover top surface 19 of insulating layer 11, bottom 22 of via 31 and sidewalls 29. Layer 16 is preferably 1000–2000 Å thick layer of TiN. Conformal layer 16 is removed from top surface 19 and bottom 22, thereby leaving 1000–2000 Å thick sidewalls 29 in via 31. Alternatively, sidewalls 29 can be etched to thicknesses of 500–1000 Å. Portions of layer 16 are preferably removed by an anisotropic dry etching process such as with a single chamber reactive ion etching apparatus or a dual chamber electron cyclotron resonance (ECR) apparatus. Structure 23 is preferably etched at an anisotropic or a 90 degree angle with respect to top surface 19. Alternatively, layer 16 may be removed by other etching or removal processes.

Figure 3:
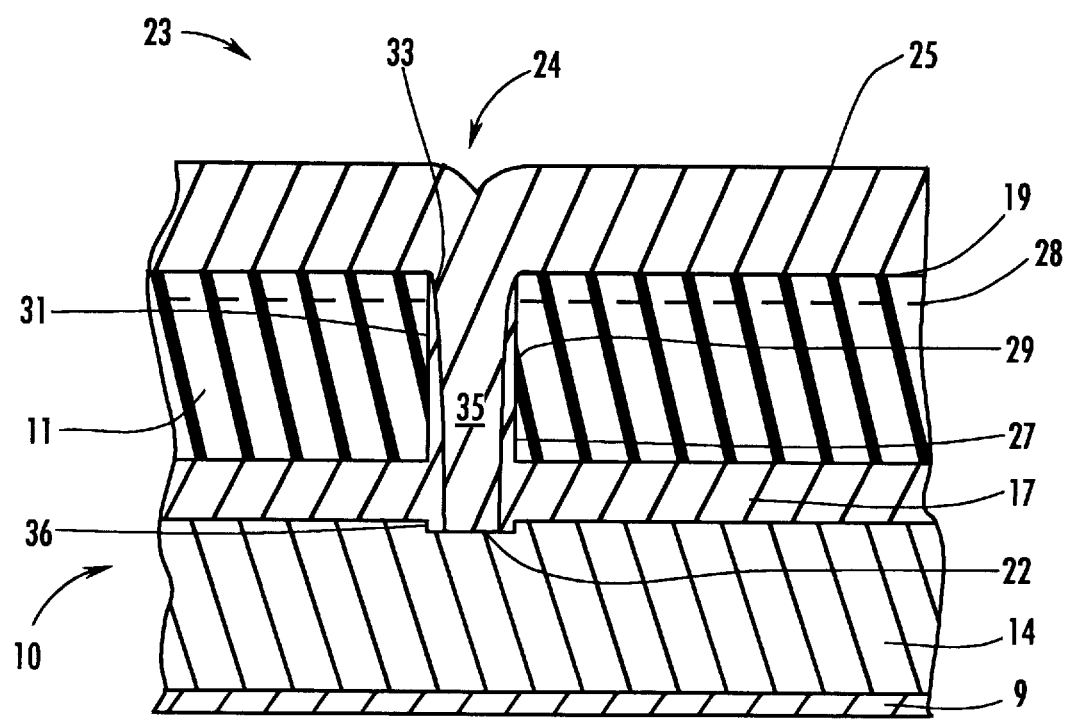
FIG. 3 is a cross-sectional view of the semiconductor device illustrated in FIG. 2 having the conformal barrier layer anisotropically etched and additionally including a copper plug.

With reference to FIG. 3, structure 23 further includes a conformal layer 25 of metal deposited within sidewalls 29 of via 31. Conformal layer 25 forms a plug or metal reservoir 35 in via 31. Conformal layer 25 and insulating layer 11 are removed to top surface 19 by an etching or planarization technique, thereby removing all of metal layer 25 from top surface 19 of insulating layer 11. Preferably, layer 25 is additionally etched below a thin upper portion 33 of sidewall 29 to prevent migration of metal over sidewall 29 into insulating layer 11.

Alternatively, reservoir 35 can be fabricated without a conformal layer 25. Reservoir 35 can be deposited by a sputtering CVD, dipping, evaporating, or other metal depositing techniques. For example, reservoir 35 can be selectively deposited near bottom 22 within sidewalls 29 of via 31.

Sidewalls 29 advantageously prevent metal from reservoir 35 from diffusing into insulating layer 11. Reservoir 35 is in contact with layer 14 at bottom 22 so layer 14 can receive metal ions or atoms from reservoir 35. For a 0.5 micron wide via 31, reservoir 35 is preferably a plug of Cu or Au created from 4000 Å to 6000 Å thick conformal layer 25 which prevents failures due to electromigration. The thickness of layer 25 is dependent upon the size of via 31. Via 31 preferably extends through barrier layer 17 so metal atoms from reservoir 25 are transmitted directly to conductive line 10.

Conformal layer 25 is preferably deposited by a sputter technique, CVD technique, collimated sputtering technique, dipping technique, evaporating technique, or by other coating or depositing techniques. Layer 25 can be removed to top surface 19 by etching, laser ablation, a chemical mechanical polish, or other planarization or removal technique having a high selectivity to layer 25 with respect to layer 11.

Sidewalls 29 and conformal layer 16 (FIG. 2) can be silicon nitride (SiN), titanium nitride (TiN), or other barrier material for preventing metal from migrating into layer 11. Alternatively, sidewalls 29 can be created from a different material than layer 17. Layer 11 can also be $SiO_2$, SiON, $SiO_xF_y$ (e.g., fluorinated $SiO_2$), BCB, or polyimide. Layer 25 can be Cu or Au or an alloy or a compound thereof.

Alternatively, structure 23 can be fabricated without a barrier layer such as barrier layer 17. In this embodiment, layer 11 directly overlays layer 14 and via 31 extends into layer 14 at a depression or an indented portion 36. Via 31 preferably extends at least 1000 Å into layer 14. With such a configuration, sidewalls 29 alone can prevent diffusion of the metal from reservoir 35 into insulating layer 11. In such an embodiment, sidewalls 29 reach from top surface 19 to indented portion 36, thereby isolating reservoir 35 from insulating layer 11.

Figure 4:
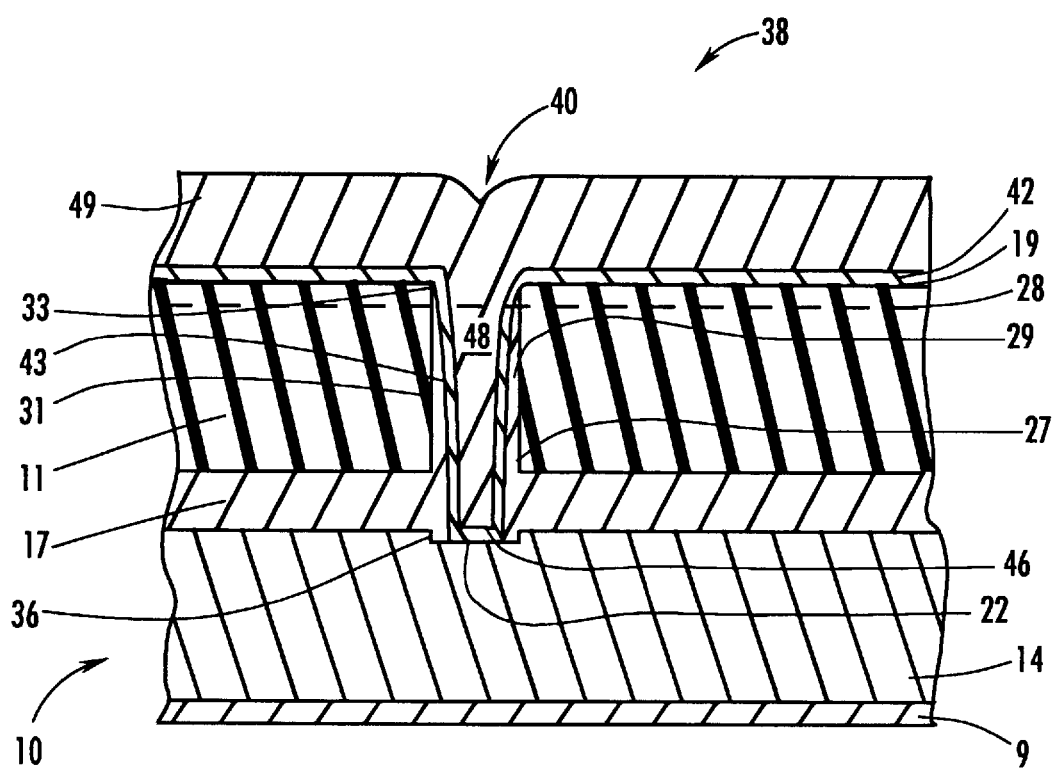
FIG. 4 is a cross-sectional view of a multilayer semiconductor device having a conformal copper layer and a tungsten plug in accordance with a second exemplary embodiment of the present invention.

With reference to FIG. 4, a semiconductor structure 38 includes a conductive via 40. Structure 38 is similar to structure 23; however, conductive via 40 includes a tungsten (W) plug 48 within a cylinder 43 of metal having a high resistance to electromigration.

Conductive via 40 is formed by providing a thin (e.g., approximately 200 Å thick) metal conformal layer 42 within via 31. Conformal layer 42 is preferably thin enough to be easily etched. Thin conformal layer 42 overlays sidewalls 29 to form cylinder 43 having a closed end 46. Cylinder 43 is overcoated with W layer 49. Conformal layer 42 and layer 49 are removed by an etch, laser ablation technique, or chemical mechanical polish (CMP) to top surface 19 thereby leaving plug 48 in cylinder 43 in via 31.

Layers 42 and 49 can be deposited by a PVD, sputtering, evaporating, dipping, CVD, or other deposition technique. Cylinder 43 can be circular or rectangular and provides a reservoir for reducing electromigration effects associated with conductive via 40. Layer 42 is preferably copper and directly contacts layer 14 at bottom 22 of via 31 at closed end 46 of cylinder 43. Alternatively, layer 49 and plug 48 can be made from other conductive materials. The use of plug 48 advantageously reduces the amount of highly electromigration resistant metal such as copper associated with conductive via 40, thereby making structure 38 easier to etch and otherwise fabricate.

Figure 5:
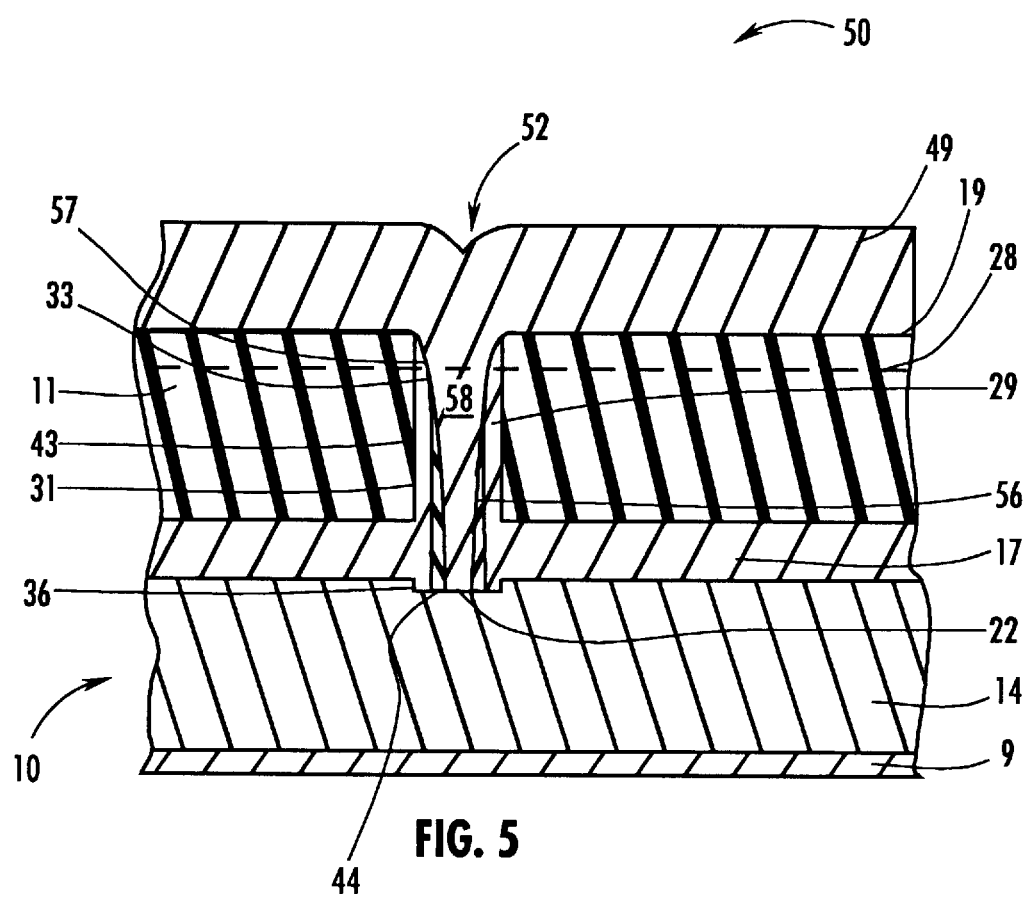
FIG. 5 is a cross-sectional view of a multilayer semiconductor device having a hollow copper cylinder and a tungsten plug in accordance with a third exemplary embodiment of the present invention.

With reference to FIG. 5, a structure 50 includes a conductive via 52. Conductive via 52 is substantially similar to conductive via 40. However, closed end 46 (FIG. 4) is removed from a metal cylinder 56 (FIG. 5). A W plug 58 extends from top surface 19 to Al layer 14.

Metal cylinder 56 is hollow and created by providing a conformal copper layer 42 within via 31 adjacent sidewall 29. Conformal copper layer 42 (FIG. 4) is directionally or anisotropically etched with a single chamber reactive ion etching apparatus or dual chamber electron cyclotron resonance apparatus to remove metal on top surface 19 of insulating layer 11 and bottom 22 of via 31. Conformal layer 42 (FIG. 4) is further etched to remove metal near a top portion 57 of sidewall 29.

After portions of layer 42 are removed and only hollow metal cylinder 56 remains, layer 49 is deposited on top surface 19 and within cylinder 56. Layer 49 is preferably 0.4–0.6 microns thick layer of W for a via 31 having a width of 0.5 microns. Preferably, structure 50 is planarized or etched to top surface 19 to leave plug 58 in cylinder 56, thereby forming conductive via 52.

It is to be understood that, while the detailed drawings and specific examples given describe preferred exemplary embodiments of the present invention, they are for the purposes of illustration only. The present invention is not limited to the precise details, methods and conditions disclosed. For example, although dry etching is suggested, material may be removed in other processes. Further, although copper is suggested, other metals having high resistance to electromigration may be used. Further still, the conductive vias can be rectangular or circular in shape. The dimensions, sizes, thicknesses and shapes are given in an exemplary fashion. For example, the various layers and lines may have different thicknesses and geometries, depending on integrated circuit designs and process technologies.

We claim:

1. A method of fabricating a semiconductor structure including a conductive line formed over an insulating layer, the insulating layer having a top side and a via extending from the top side of the insulating layer to a bottom, the semiconductor structure being less susceptible to electromigration failures associated with the via, the method comprising steps of:

depositing a conformal barrier layer over the via;
   removing the conformal barrier layer from the top side of the insulating layer and the bottom of the via, thereby leaving a barrier sidewall in the via;
   depositing a first metal, wherein the first metal includes copper, within the via; and
   forming a plug by depositing a second metal above the first metal, thereby reducing electromigration failures on the conductive line.

2. The method of claim 1 wherein the second metal is tungsten.

3. The method of claim 1 wherein the copper is combined with other elements to form a copper compound.

4. A method of fabricating a semiconductor structure including a conductive line, a first barrier layer formed over the conductive line, the first barrier layer having a bottom side, an insulating layer formed over the first barrier layer, the insulating layer having a top side, the semiconductor structure being less susceptible to electromigration failures associated with the via, the method comprising steps of:

etching a hole from the top side of the insulating layer through the bottom side of the first barrier layer to form a via, the via having a bottom;
   depositing a conformal barrier layer over the via;
   removing the conformal barrier layer from the top side of the insulating layer and the bottom of the via, thereby leaving a barrier sidewall in the via; and
   depositing a metal, wherein the metal is deposited as a copper material, the copper material filling the via and being in direct contact with the conductive line, thereby reducing electromigration failures on the conductive line.

5. The method of claim 4 wherein the first barrier layer includes titanium nitride.

6. The method of claim 4, further comprising:
   depositing tungsten above the metal in the via.

7. The method of claim 4 wherein the copper material forms a copper plug.

8. The method of claim 4 wherein the conductive line includes aluminum.

9. The method of claim 4 wherein the metal is deposited as a conformal layer.

10. A method of fabricating a semiconductor structure including a conductive line formed over an insulating layer, the insulating layer having a top side and a via extending from the top side of the insulating layer to a bottom, the semiconductor structure being less susceptible to electromigration failures associated with the via, the method comprising steps of:

depositing a conformal barrier layer over the via;
    removing the conformal barrier layer from the top side of the insulating layer and the bottom of the via, thereby leaving a barrier sidewall in the via;
    depositing a first metal within the via, wherein the first metal is a conformal copper alloy layer, and
    forming a plug by depositing a second metal above the first metal, thereby reducing electromigration failures on the conductive line.

11. The method of claim 10 wherein the second metal is tungsten.

12. The method of claim 10 wherein the first metal is etched to leave copper alloy sidewalls in the via.

13. The method of claim 10 wherein the conformal copper alloy layer is deposited by chemical vapor deposition.

14. The method of claim 10 further comprising:
    removing the copper alloy layer from the top side of the insulating layer and the bottom of the via, thereby leaving a copper alloy sidewall adjacent the barrier sidewall.

15. The method of claim 14 wherein said forming includes depositing tungsten in the via to form a tungsten plug adjacent the copper alloy sidewall.

16. The method of claim 15 wherein the steps of removing are performed by anisotropic etching with a single chamber reactive ion etching apparatus or with a dual chamber electron cyclotron resonance apparatus.

17. The method of claim 10 wherein the copper alloy is deposited by a chemical vapor deposition technique, a plasma assisted deposition technique or a sputter technique.

18. The method of claim 10 wherein the copper alloy includes gold.

19. The method of claim 18 wherein the copper alloy includes tungsten.

* * * * *